United States Patent [19]

Nakamura

[11] Patent Number: 5,459,736
[45] Date of Patent: Oct. 17, 1995

[54] SCAN PATH CIRCUIT FOR TESTING MULTI-PHASE CLOCKS FROM SEQUENTIAL CIRCUITS

[75] Inventor: Yoshiyuki Nakamura, Tokyo, Japan

[73] Assignee: NEC Corporation, Tokyo, Japan

[21] Appl. No.: 65,177

[22] Filed: May 20, 1993

[30] Foreign Application Priority Data

May 20, 1992 [JP] Japan ................................. 4-127001

[51] Int. Cl.$^6$ ..................................................... G01R 31/28
[52] U.S. Cl. ........................ 371/22.3; 371/25.1; 324/158.1
[58] Field of Search .......................... 371/25, 25.1, 22.3; 324/158 R; 365/154

[56] References Cited

U.S. PATENT DOCUMENTS

| | | | |
|---|---|---|---|
| 4,534,028 | 8/1985 | Trischler | 371/25 |
| 4,669,061 | 5/1987 | Bhavsar | 365/154 |
| 4,860,290 | 8/1989 | Daniels et al. | 371/25 |
| 4,942,577 | 7/1990 | Osaki | 371/22.3 |
| 5,043,986 | 8/1991 | Agrawal et al. | 371/25.1 |
| 5,130,646 | 7/1992 | Kojima | 324/158 R |
| 5,130,647 | 7/1992 | Sakashita et al. | 324/158 R |

FOREIGN PATENT DOCUMENTS 3181098  7/1991  Japan.
3316692  11/1991  Japan.

*Primary Examiner*—Emanuel T. Voeltz
*Assistant Examiner*—Alan Tran

[57] ABSTRACT

A scan path circuit for testing multi-phase clocks of sequential circuits is capable of preventing a clock skewing and includes a plurality of scan circuits coupled to respective clock testing circuits each including a latch circuit receiving a clock signal and a clock mode signal to output a latch output signal, and a control gate which outputs a control signal. The scan circuits each includes two latch circuits and a control gate which receives a test clock signal. The scan circuits operate as flip-flops during a non-testing period. When a scan mode signal is "0" and a clock signal is "1" an output of the latch circuit of the testing circuit becomes "1" and an output of the control gate thereof becomes a value of a first test clock signal. This value is used as a clock of the scan circuit, and a data input signal is taken into the respective scan circuit. When the clock signal is "0", the output of the latch circuit of the clock testing circuit becomes "0" and the output of the control gate thereof becomes "0". Thus, no input data is taken into the scan circuit, and a value of a scan input is held.

5 Claims, 10 Drawing Sheets

1

SCAN PATH CIRCUIT FOR TESTING MULTI-PHASE CLOCKS FROM SEQUENTIAL CIRCUITS

BACKGROUND OF THE INVENTION

The present invention relates to a logic integrated circuit, and more particularly to a scan path circuit for testing a sequential circuit.

1. Description of the Related Art

In general, it is difficult to test a sequential circuit within a logic integrated circuit in comparison with a combinational circuit, and many design for testability methods have been carried out. Among them, a scan path method which enables direct application to flip-flops from external or direct observation of FFs has been widely used.

However in a conventional scan path circuit, problems arise, for example, a malfunction is caused by a clock skew during scan shifting, multi-phase clocks can not be handled, or a clock failure can not be detected.

In Japanese Patent Laid-Open No. 3-181098, a logic integrated circuit including flip-flop circuits where a problem of the clock skew on shifting is solved is disclosed. However, in such flip-flop circuits, as shown in FIG. 1, a clock signal CK and a second clock signal SCKO are applied in common to a plurality of flip-flop circuits 60, and thus there is restriction in design in that all the flip-flop circuit are necessarily operated by the same clock signal CK. Hence, multi-phase clocks cannot be handled.

In Japanese Patent Application No. 3-316692, another logic integrated circuit obtained by a scan design so as to solve the clock skew problem on shifting and to enable a handling of multi-phase clocks is disclosed.

In this logic integrated circuit, as shown in FIG. 2, two clock signals CK1 and CK2 and a first test clock signal SCK1 are selected by a test mode signal TS. That is, when no testing is carried out, the flip-flop circuits 60 are operated by two-phase clocks of the two clock signals CK1 and CK2, and, when a testing is carried out, the flip-flop circuits 60 are operated by the first test clock signal SCK1 and a second test clock signal SCK2.

However, in this circuit, the two clock signals CK1 and CK2 are not used at the testing, and hence the testing of the two clock signals CK1 and CK2 can not be performed. Further, in this logic integrated circuit, the used flip-flop circuits must be positive flip-flop circuits, which is restriction in design.

Generally, in logic integrated circuits, multi-phase clocking scheme is widely used. Thus, design for testability method is required to deal with such a logic integrated circuit, and all parts within a circuit should be testable.

However, in the conventional logic integrated circuit, as described above, when the normal clocks and the test clocks are used together, the multi-phase clocks can not be handled, and also, when the normal clocks are selected by the test mode signal, the normal clocks can not be tested.

SUMMARY OF THE INVENTION

It is therefore an object of the present invention to provide a logic integrated circuit which in view of the aforementioned problems of the prior art, is capable of preventing a clock skew problem on shifting, handling polyphase clocks and carrying out a testing of all clocks.

In accordance with one aspect of the present invention, there is provided a logic integrated circuit, comprising:

(a) a clock control circuit including:

(a1) a first latch circuit for inputting a clock signal and a clock mode signal at a data input terminal and an enable terminal, respectively, to output a first latch output signal; and (a2) a first control gate for inputting the first latch output signal and first test clock signal at two input terminals to output a control output signal: and (b) a scan circuit including:

(b1) a second latch circuit for inputting either a data input signal or the first test clock signal at data input terminal either directly or via a selector and inputting a scan mode signal at selection terminal to output a second latch output signal, the second latch circuit having an enable terminal:

(b2) a third latch circuit for inputting the second latch output signal and the control output signal at a data input terminal and an enable terminal, respectively, to output a data output signal: and (b3) a second control gate for inputting the control output signal and a second test clock signal at two input terminals, the second control gate having an output terminal connected to the enable terminal of the second latch circuit.

The first test clock signal, the second test clock signal, and the clock mode signal can be fixed to predetermined values at no testing time.

The clock control circuit can be connected to either one scan circuit or a plurality of scan circuits.

The first control gate is one of an AND gate, a NAND gate, an OR gate and a NOR gate and the second control gate is one of the AND gate, the NAND gate, the OR gate and the NOR gate.

BRIEF DESCRIPTION OF THE DRAWINGS

The objects and features and advantages of the present invention will become more apparent from the consideration of the following detailed description taken in conjunction with the accompanying drawings in which.

DESCRIPTION OF THE PREFERRED EMBODIMENTS

Figure 3A:
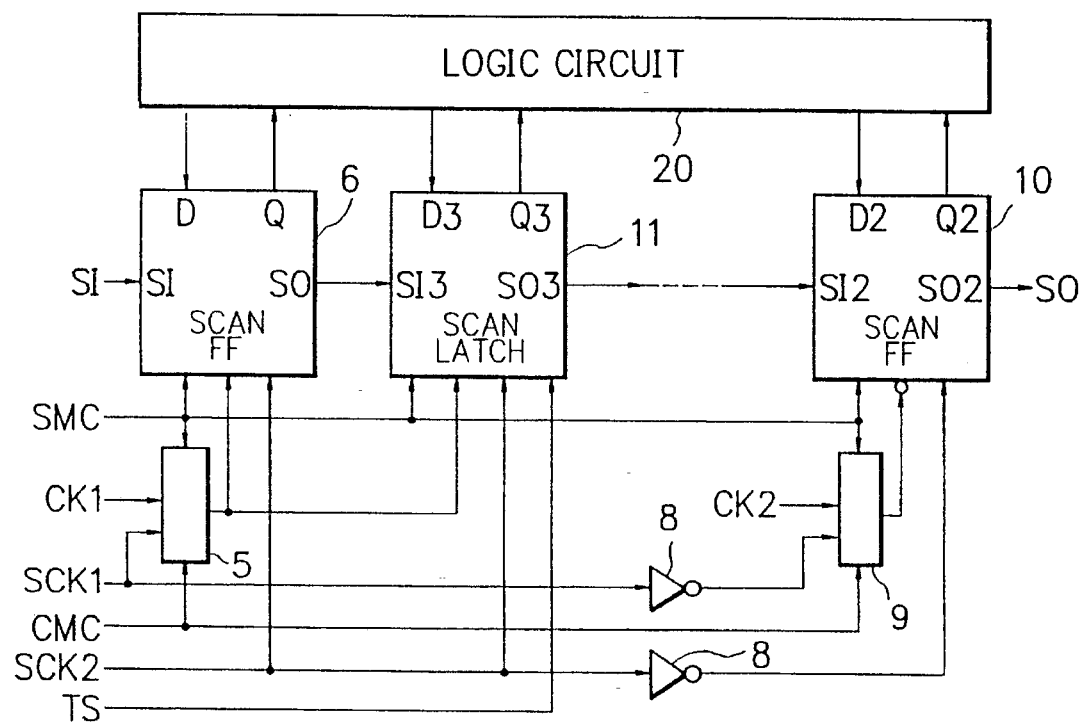
FIGS. 3a and 3b block diagrams of a first embodiment of a logic integrated circuit according to the present invention.
Figure 3B:
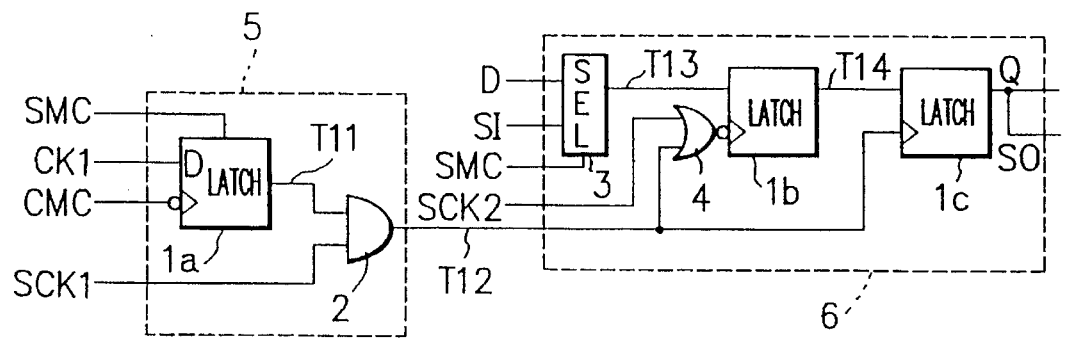

Referring now to the drawings, wherein like reference characters designate like or corresponding parts throughout the figures of the drawings and thus the repeated description thereof can be omitted for brevity, there is shown in FIGS. 3a and 3b the first embodiment of a logic integrated circuit according to the present invention. FIG. 3a shows of the logic integrated circuit and FIG. 3b shows in detail a clock control circuit 5 and a scan circuit 6 shown in FIG. 3a.

In this embodiment, the clock control circuit 5 includes a first latch circuit 1a and an AND gate 2. A clock signal CK1, a clock mode signal CMC and a scan mode signal SMC are input to a data input terminal, an enable terminal and a set terminal, respectively, of the first latch circuit 1a to output a latch output signal T11, and the latch output signal T11 and a first test clock signal SCK1 are input to two input terminals of the AND gate 2 to output an AND output signal T12.

The scan circuit 6 includes a selector 3, a second latch circuit 1b, a third latch circuit 1c and a NOR gate 4. A data input signal D, a scan input signal SI and the scan mode signal SMC are input to two data input terminals and a selection terminal, respectively, of the selector 3 to output a selector output signal T13, and the selector output signal T13 is input to a data input terminal of the second latch circuit 1b to output a latch output signal T14. The latch output signal T14 and the AND output signal T12 are input to a data input terminal and an enable terminal, respectively, of the third latch circuit 1c to output a data output signal Q. The AND output signal T12 and a second test clock signal SCK2 are input to two input terminals of the NOR gate 4 and its output terminal is coupled with an enable terminal of the second latch circuit 1b.

Figure 4:
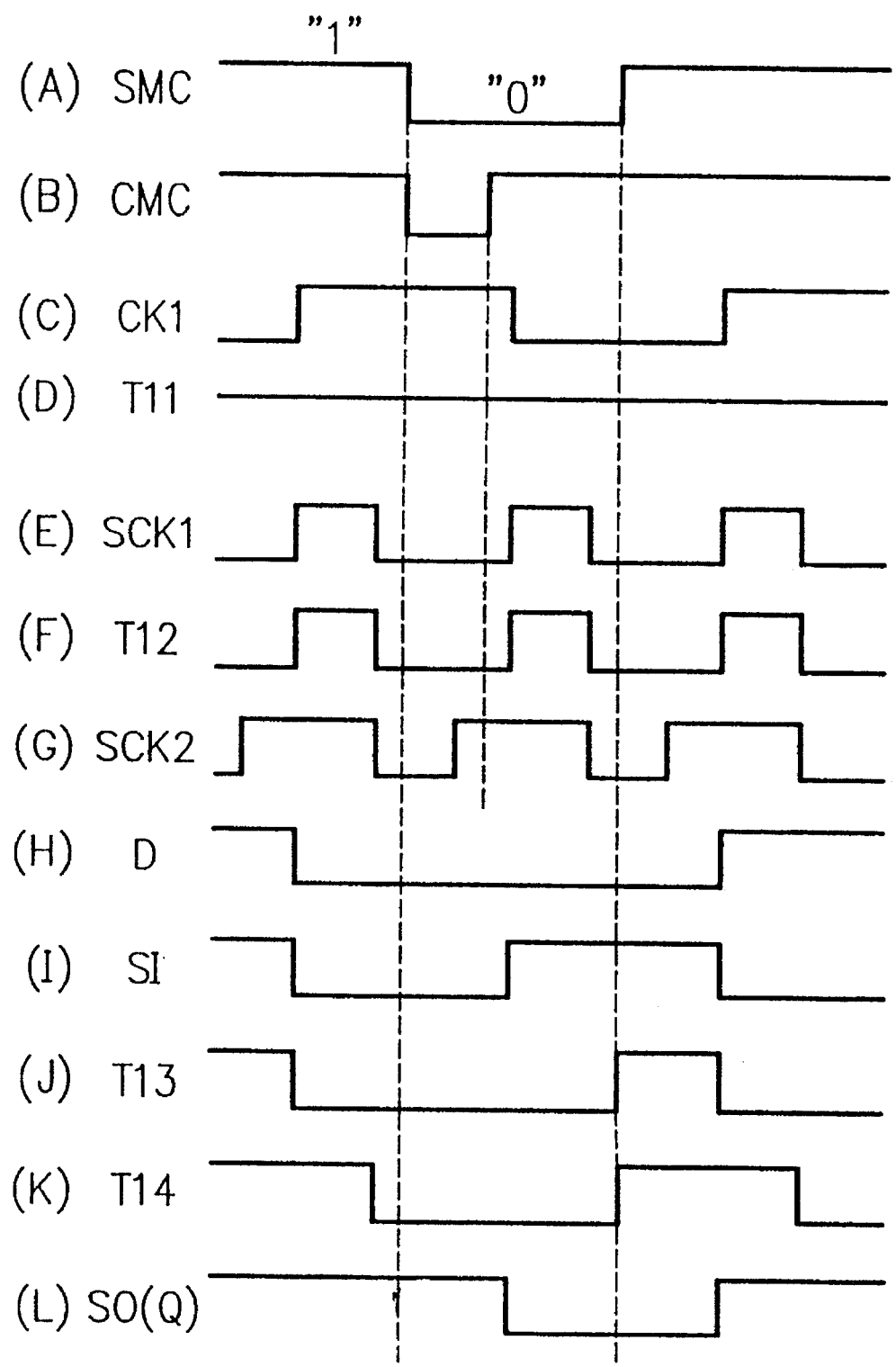
FIG. 4 is a timing chart showing waveforms of clocks for explaining a normal operation of the circuit shown in FIGS. 3a and 3b.
Figure 5:
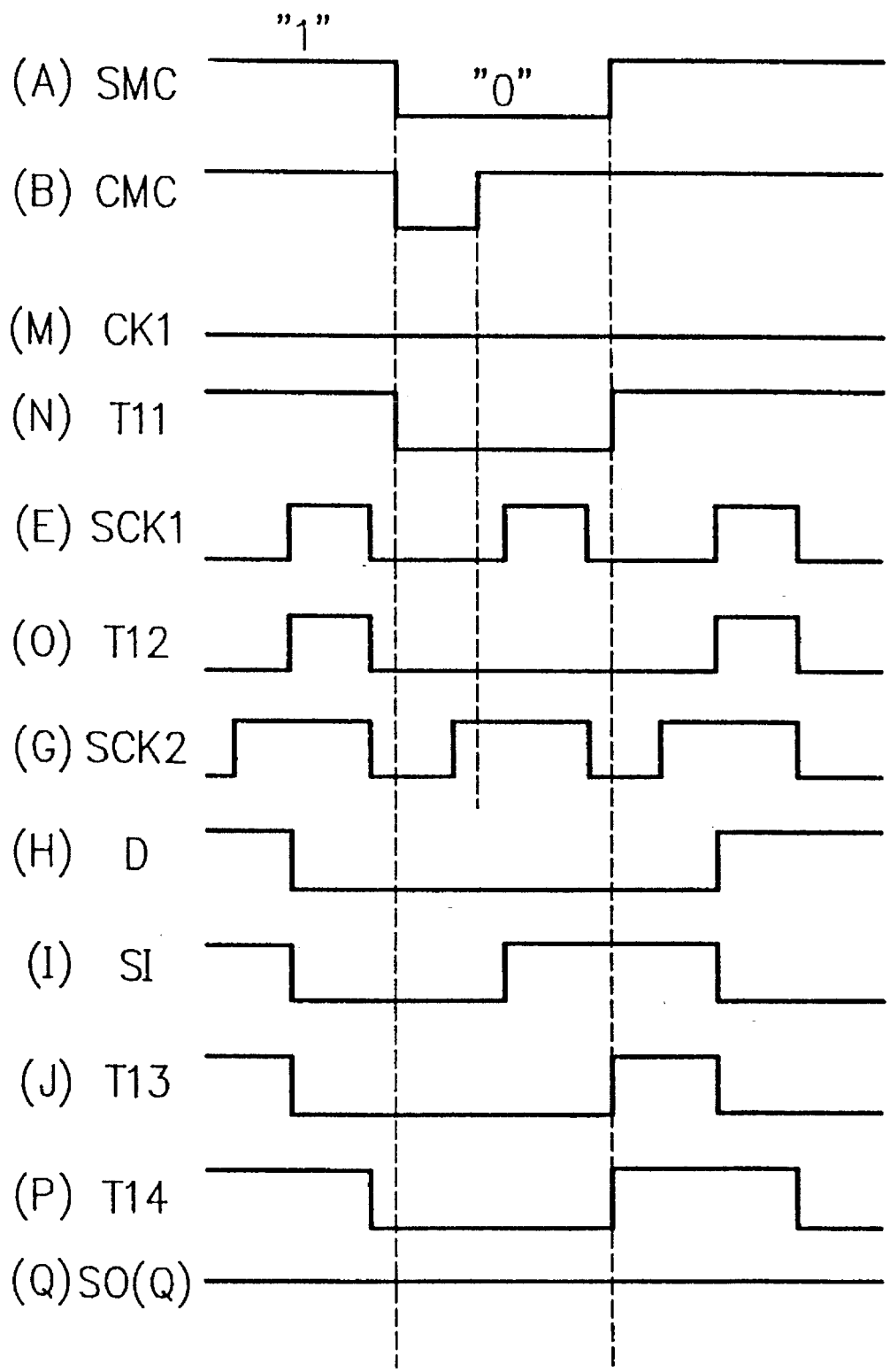
FIG. 5 is a timing chart showing waveforms of clocks for explaining an operation of the circuit shown in FIGS. 3a and 3b when erroneous clocks are used.
Figure 6:
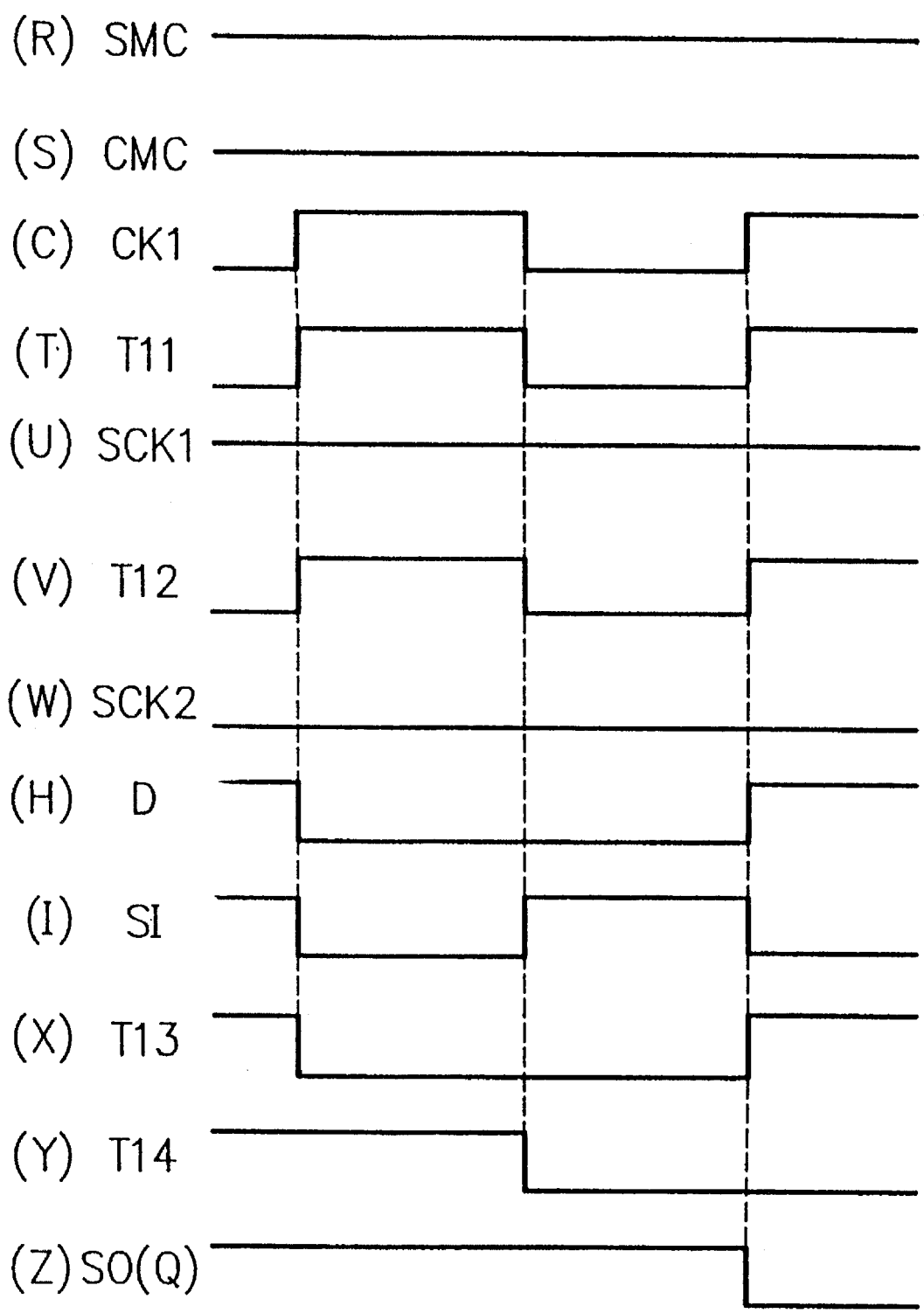
FIG. 6 is a timing chart showing waveforms of clocks for explaining an operation of the circuit shown in FIGS. 3a and 3b when no testing is carried out.

FIG. 4 shows a normal operation of the logic integrated circuit, FIG. 5 shows an erroneous clock signal operation of the logic integrated circuit and FIG. 6 shows a non testing operation of the logic integrated circuit.

As to the latch output signal T11 of the first latch circuit 1a, as shown by (A), (B), (C) and (D) in FIG. 4 and (A), (B), (M) and (N) in FIG. 5, when the scan mode signal SMC is "1", the latch output signal T11 becomes "1" regardless of the other values; when the scan mode signal SMC is "0" and the clock mode signal CMC is also "0", the clock signal CK1 is output as the latch output signal T11; and when the scan mode signal SMC is "0" and the clock mode signal CMC is "1", the value is held.

In the clock control circuit 5, the latch output signal T11 and the first test clock signal SCK1 are input to the two input terminals of the AND gate 2. The AND output signal T12 of the AND gate 2, as shown by (D), (E), and (F) in FIG. 4 and (N), (E), and (O) in FIG. 5, becomes a logical product of the latch output signal T11 of the first latch circuit 1a and the first test clock signal SCK1.

The selector output signal T18 of the scan circuit 6, as shown by (H), (I), and (J) in FIG. 4, becomes the value of the data input signal D when the scan mode signal SMC is "0"; and becomes the value of scan input signal SI when the scan mode signal SMC is "1".

The latch output signal T14 of the second latch circuit 1b, as shown by (F), (G), (J) and (K) in FIG. 4 and (O), (G), (J) and (P) in FIG. 5, becomes the value of the selector output signal T13 when both the second test clock signal SCK2 and the AND output signal T12 of the clock control circuit 5 are "0", and otherwise the value is held.

The data output signal Q of the third latch circuit 1c and an SO value, as shown by (F), (K) and (L) in FIG. 4 and (O), (P) and (Q) in FIG. 5, becomes the value of the latch output signal T14 of the second latch circuit 1b when the AND output signal T12 of the clock control circuit 5 is "1", and the value is held when the AND output signal T12 is "0".

Next, the operation at the testing mode in this embodiment will now be described in connection with FIGS. 4 and 5. First, when a shift operation is executed, the scan mode signal SMC is set to "1". Since the latch output signal T11 of the first latch circuit 1a is always "1", the AND output signal T12 of the clock control circuit 5 does not depend on the clock signal CK1 and becomes the value of the first test clock signal SCK1. This means that the clock used for the shift operation does not depend on the clock signal CK1, and hence it means that a polyphase clock can be used as the clock signal CK1.

Concerning the scan circuit 6, when the scan mode signal SMC is "1", the selector 3 selects the scan input signal SI. In order to exactly carry out the shift operation of the scan input signal SI, both the enable signals of the second latch circuit 1b and the third latch circuit 1c must not be "1" at the same time.

As shown by (F) and (G) in FIG. 4 and (O) and (G) in FIG. 5, the leading edge of the second test clock signal SCK2 rises earlier than that of the AND output signal T12 of the clock control circuit 5.

Therefore, when the enable signal of the third latch circuit 1c is changed from "0" to "1", the enable signal of the second latch circuit 1b becomes "0" by the NOR gate 4. By this function, the delay difference of the clock signals in the range of the time difference of the leading edges of the first test clock signal SCK1 and the second test clock signal SCK2 can be absorbed.

Further, it is assumed by the NOR gate 4 that, while the enable signal of the third latch circuit 1c is "1", the enable signal of the second latch circuit 1b is "0". Thus, a malfunction due to the delay difference of the leading edges can not be caused. Hence, in the logic integrated circuit of this embodiment. The malfunction due to the clock skew can be avoided.

Figure 1:
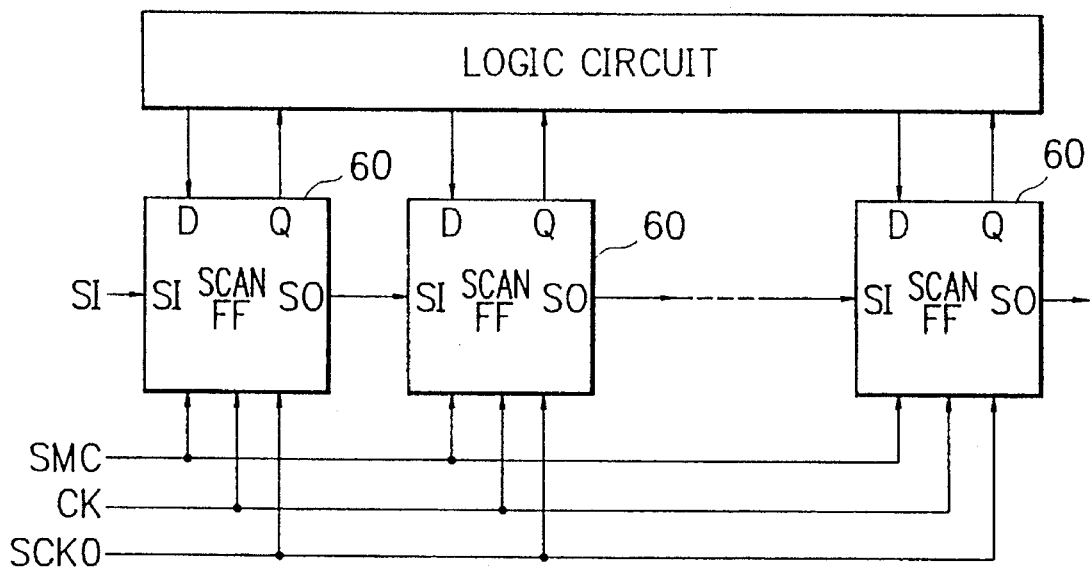
FIG. 1 is a block diagram of a conventional logic integrated circuit.
Figure 2:
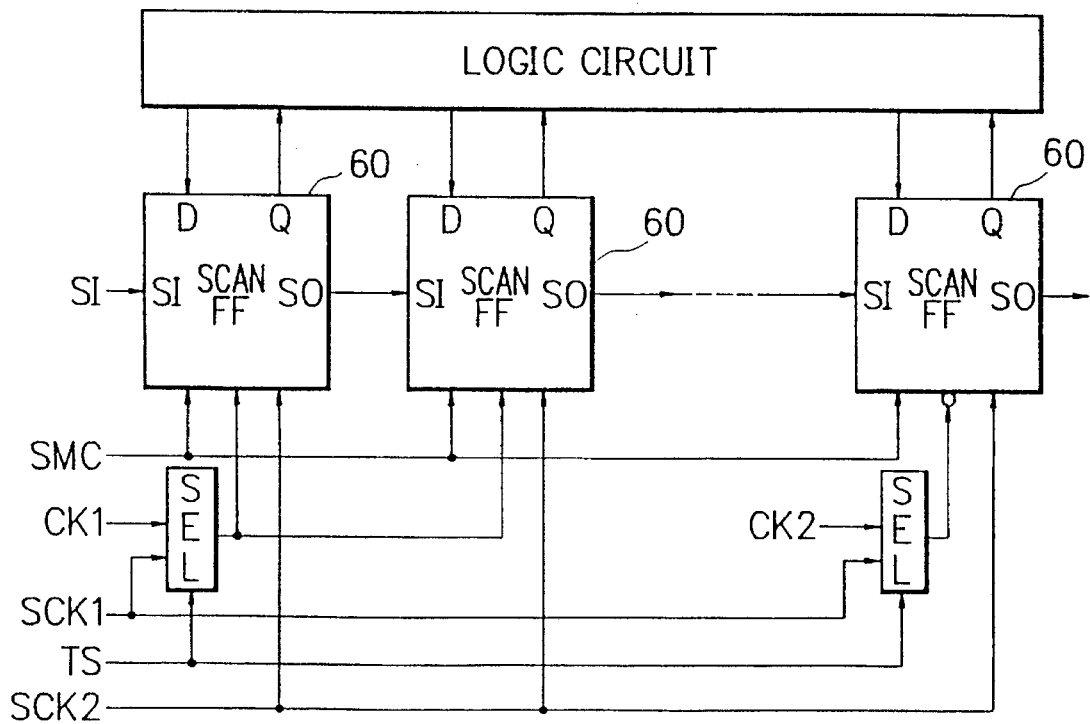
FIG. 2 is a block diagram of another conventional logic integrated circuit.

The different point from the conventional logic integrated circuit shown in FIGS. 1 and 2, is that the scan circuit can be used as a flip-flop having a different clock polarity and a latch when no testing is carried out and that a plurality of different clock signals can be used and a failure detection of these clock signals can be possible as described above.

Next, what the error of the clock signal CK1 can be detected in the logic integrated circuit in this embodiment will now be described. That is, when the scan mode signal SMC is set to "0" and the clock mode signal CMC is varied as shown by (B) in FIG. 4, as shown by (D) in FIG. 4 and (N) in FIG. 5, the value of the clock signal CK1 is taken into the first latch circuit 1a.

Now, it is assumed that the value of the clock signal CK1 is changed as shown by (C) in FIG. 4. At this time, the value of the latch output signal T11 of the first latch circuit 1a becomes "1" as shown by (D) in FIG. 4, and hence the AND output signal T12 of the clock control circuit 5 becomes the value of the first test clock signal SCK1 as shown by (F) in FIG. 4. The value of the data input signal D is taken into the scan circuit 6 as shown by (H) and (L) in FIG. 4.

Now, it is assumed that the value of the clock signal CK1 is erroneous as shown by (M) in FIG. 5. At this time, the value of the latch output signal T11 is changed to "0" as shown by (N) in FIG. 5, and, when the value of the scan mode signal SMC is "0", the AND output signal T12 of the clock control circuit 5 is held to "0" as shown by (O) in FIG. 5.

Hence, the scan circuit 6 holds the data value input by the previous scan as shown by (Q) in FIG. 5. The difference of the output signal of the scan circuit 6 can be observed at the external by then repeating the shift operation.

As shown in FIG. 6, at no testing time, by fixing the scan mode signal SMC, the clock mode signal CMC, the first test clock signal SCK1 and the second test clock signal SCK2 to "0", "0", "1" and "0", respectively, the logic integrated circuit acts as the flip-flop in which the data input signal D is the data input and the clock signal CK1 is the clock input.

Figure 7:
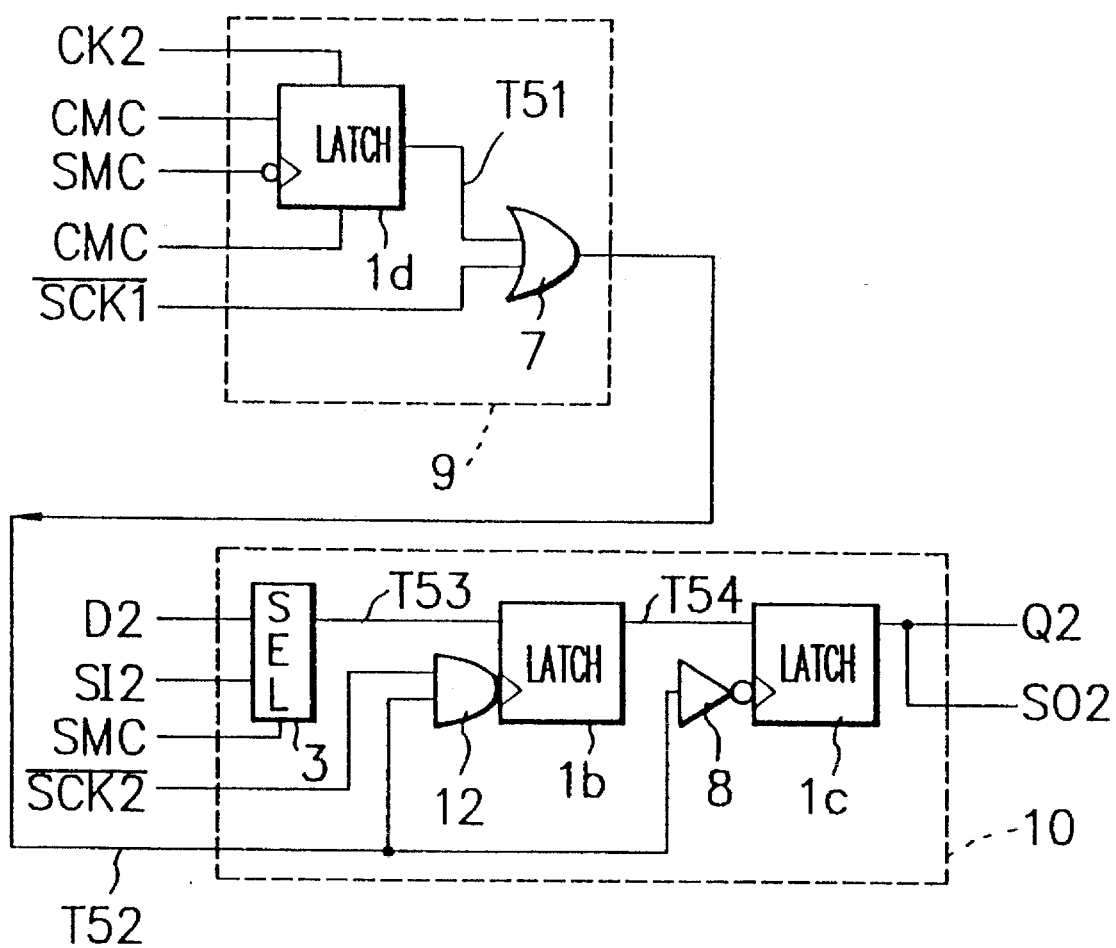
FIG. 7 is a detailed block diagram of an essential part of a second embodiment of a logic integrated circuit according to the present invention.

Although the logic integrated circuit shown in FIG. 3a in the first embodiment acts as a flip-flop of a positive clock at no testing time, for operating as a flip-flop of a negative clock at no testing time, as shown in FIG. 7, a clock control circuit 9 for a negative clock and a scan circuit 10 are provided in the second embodiment of a logic integrated circuit according to the present invention in place of the clock control circuit 5 and the scan circuit 6 in the first embodiment.

In the second embodiment, as shown in FIG. 7, the clock control circuit 9 includes a latch circuit 1d and an OR gate 7, and the scan circuit 10 includes a second latch circuit 1b, a third latch circuit 1c, an AND gate 12 whose output is coupled with an enable terminal of the second latch circuit 1b. a selector 3 and an inverter 8 whose output is coupled with an enable terminal of the third latch circuit 1c.

A second clock signal CK2, the clock mode signal CMC and the scan mode signal SMC are input to the latch circuit 1d to output an output signal T51, and the output signal T51 and an inverted value of the first test clock signal SCK1 are input to the OR gate 7 to output an output signal T52.

A second data input signal D2, a second scan input signal S12 and the scan mode signal SMC are input to the selector 3 to output an output signal T53 to the second latch circuit 1b, and the second latch circuit 1b outputs an output signal T54 to the third latch circuit 1c. The third latch circuit 1c outputs a data output signal Q2. The output signal T52 and an inverted value of the second test clock signal SCK2 are input to the AND gate 12, and the output signal T52 is sent to the enable terminal of the third latch circuit 1c via the inverter 8.

When the scan mode signal SMC is "1", the output signal T51 of the latch circuit 1d always "0", and hence the output signal T52 of the clock control circuit 9 becomes the inverted value of the first test clock signal SCK1.

When the scan mode signal SMC is "0", depending on the value of the second clock signal CK2, the clock control circuit 9 outputs either the inverted value of the first test clock signal SCK1 or "1". The second clock signal SCK2 is inverted to be input to the scan circuit 10, and hence the AND gate 12 is connected in place of the NOR gate 4 shown in FIG. 3b.

Figure 8:
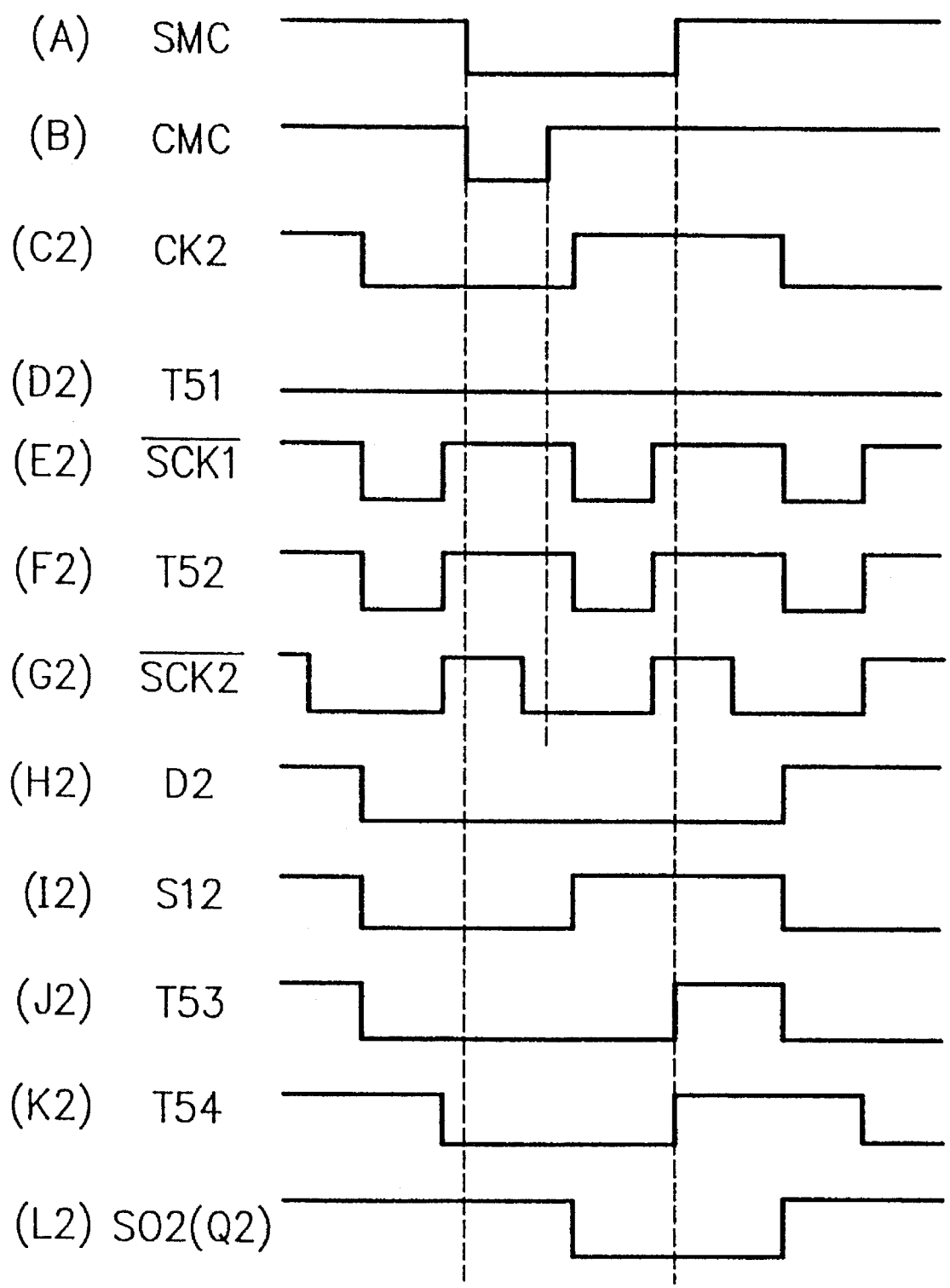
FIG. 8 is a timing chart showing waveforms of clocks for explaining a normal operation of the circuit shown in FIG. 7.
Figure 9:
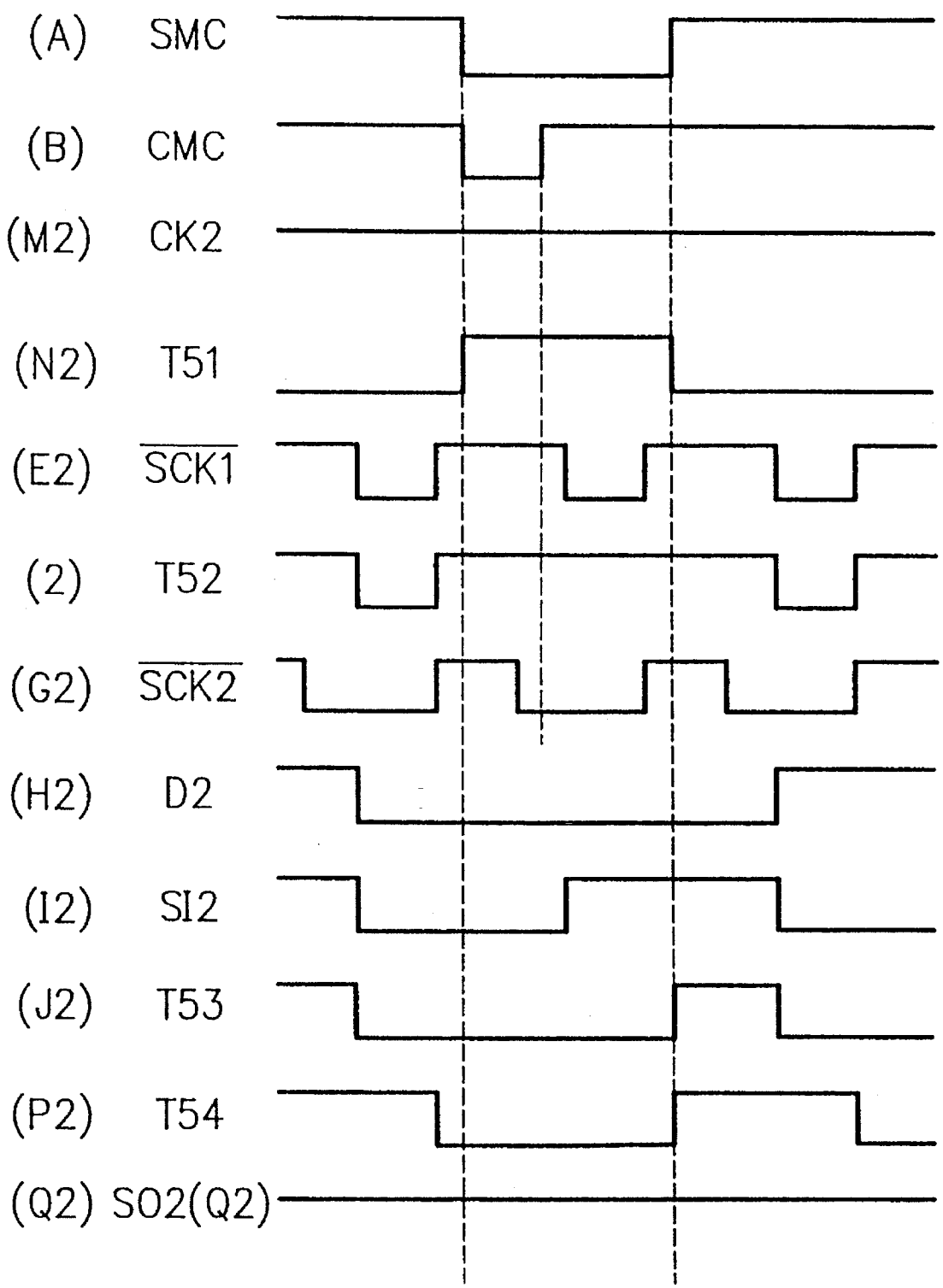
FIG. 9 is a timing chart showing waveforms of clocks for explaining an operation of the circuit shown in FIGS. 7 when erroneous clocks are used.

FIG. 8 shows a normal operation of the logic integrated circuit and FIG. 9 shows an erroneous clock signal operation of the logic integrated circuit. The difference of the second clock signal CK2 is observed as a difference of a scan output signal SO2.

Figure 10:
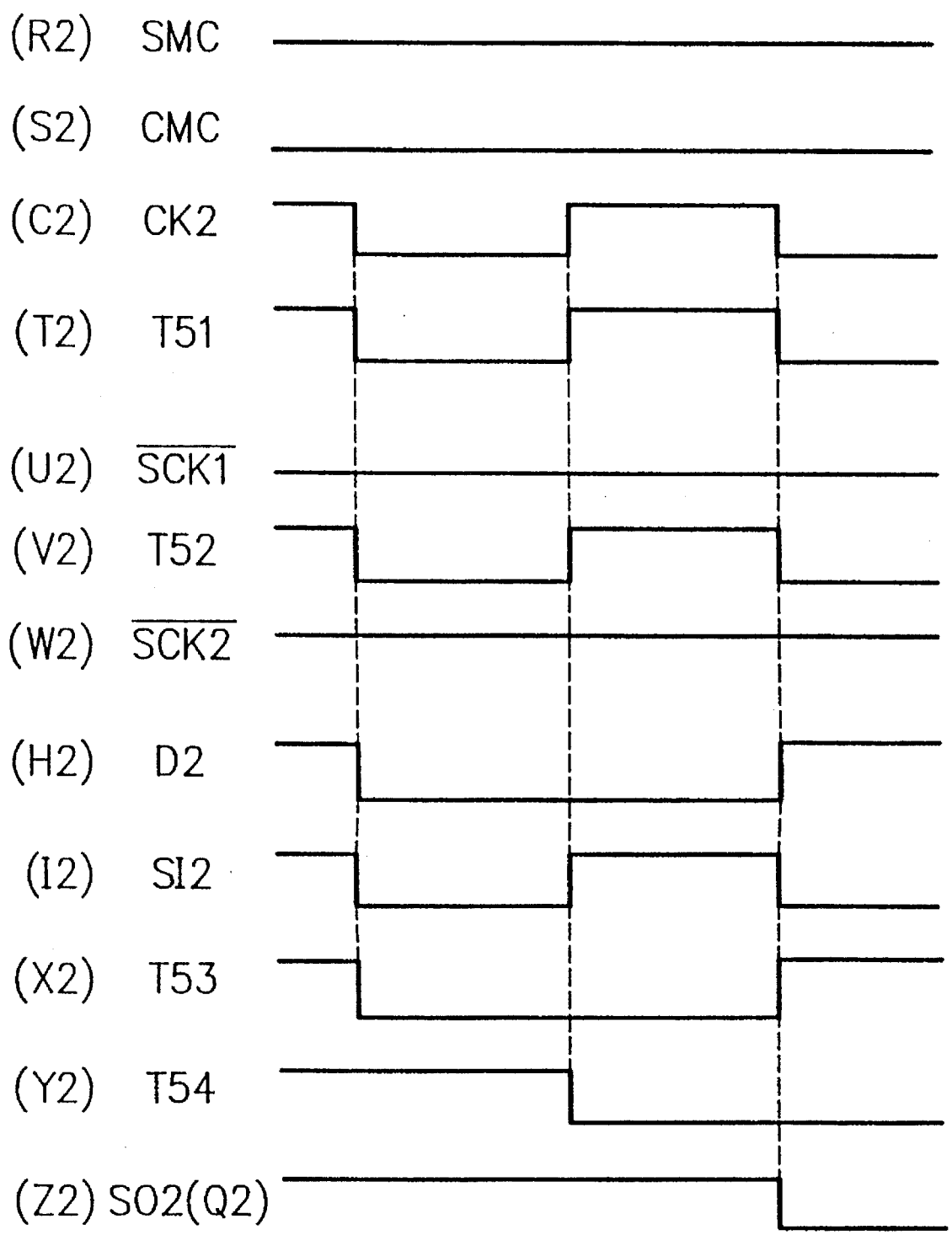
FIG. 10 is a timing chart showing waveforms of clocks for explaining an operation of the circuit shown in FIGS. 7 when no testing is carried out.

In this case, also, at no testing time, as shown in FIG. 10, by fixing the scan mode signal SMC, the clock mode signal CMC, the first test clock signal SCK1 and the second test clock signal SCK2 to "0", "0", "1" and "0", respectively, the logic integrated circuit acts as the flip-flop in which the data input signal D2 is the data input and the value of the clock signal CK2 is the clock input.

Figure 11:
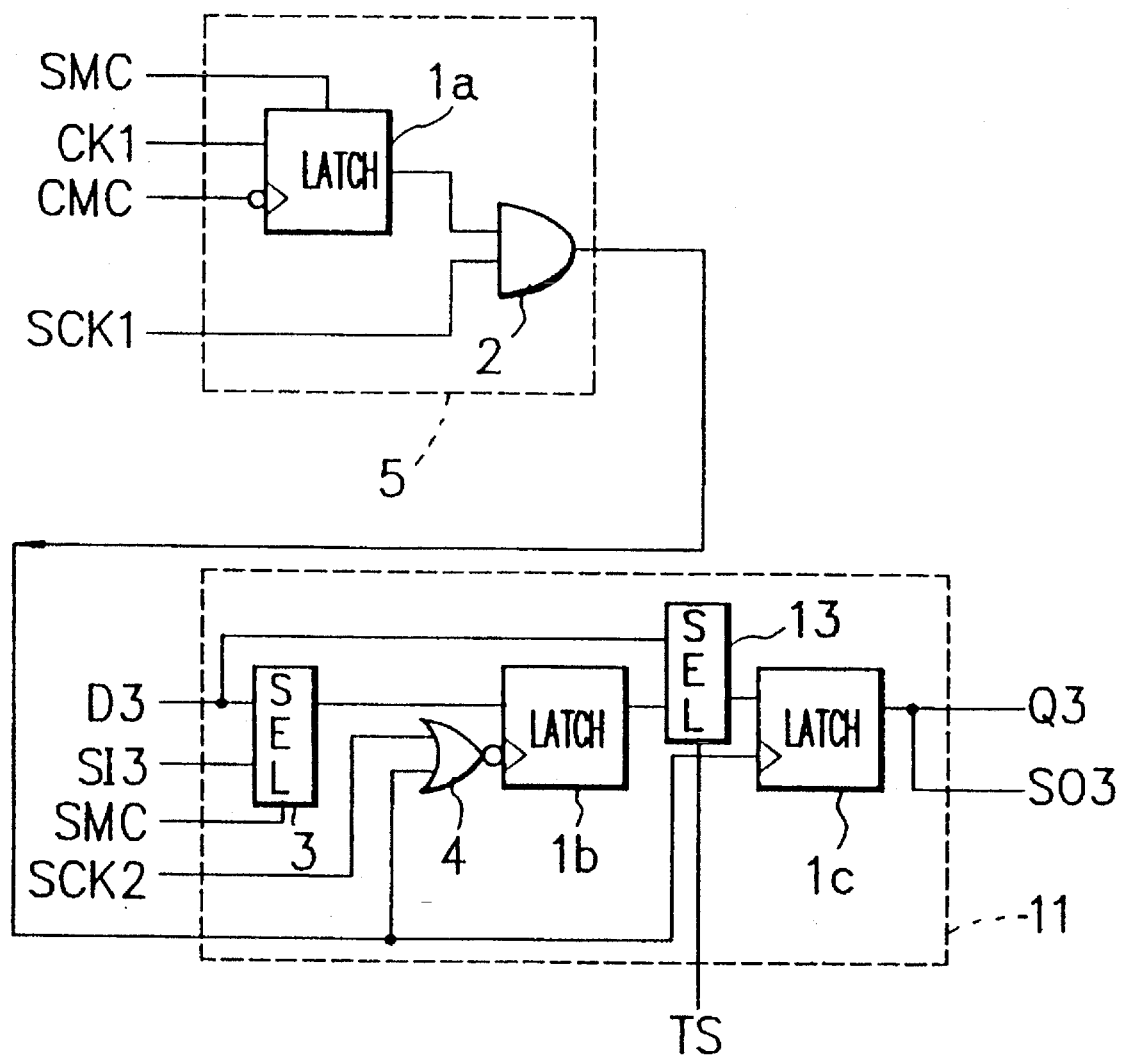
FIG. 11 is a detailed block diagram of an essential part of a third embodiment of a logic integrated circuit according to the present invention.

Although the logic integrated circuit in the above-described first and second embodiments acts as the flip-flop at no testing time, in the third embodiment of a logic integrated circuit shown in FIG. 11, by constructing a latch-scan circuit 11 as shown in FIG. 11, the logic integrated circuit can be operated as a latch at no testing time.

In the third embodiment, as shown in FIG. 11, the latch-scan circuit 11 has the same construction as the scan circuit 6 in the first embodiment, except that another selector 13 is inserted between the second latch circuit 1b and the third latch circuit 1c. A test mode signal TS is input to the selector 13. The test mode signal TS becomes always "0" at no testing time. When the test mode signal TS is "1", the output of the second latch circuit 1b becomes the output of the selector 13, and thus the latch-scan circuit 11 can operate in the same manner as the scan circuit 6 in the first embodiment.

In the latch-scan circuit 11, when the latch operation is not required from the viewpoint of the circuit, the selector 13 can be omitted and the effects of this embodiment can not be changed.

When the test mode signal TS is "0", a data input signal D3 becomes the output of the selector 13, and hence the logic integrated circuit can act as the latch circuit in which the data input signal D3 is the data input.

Similarly, a selector can be inserted between the second latch circuit 1b and the third latch circuit 1c in the scan circuit 10 shown in FIG. 7. In this case, at no testing time, the logic integrated circuit can act as a latch circuit of a negative clock.

As described above, in the present invention, the first and second test clock signals are used and the clock signal and the first test clock signal are supplied to the scan circuit via the clock control circuit. Hence, no clock skew problem is caused, and polyphase clocks can be handled. Further, a testing of all clock signals can be carried out.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A scan path circuit for a multi-phase clock testing comprising:

a clock testing circuit receiving a clock pulse signal to be tested and comprising:

a first latch circuit inputting the clock pulse signal and a clock mode signal to a data input terminal and an enable terminal thereof, respectively, and outputting therefrom a first latched signal, and a first control gate inputting thereto the first latched signal and a first test clock signal different in phase from the clock pulse signal and outputting therefrom a first control signal; and a plurality of scan circuits respectively connected to said clock testing circuit and operable as flip-flops in a non-testing period of said scan path circuit and each comprising:

a selector receiving a data input signal and a scan input signal, for selecting either of them to be output as a selected signal in accordance with a scan mode signal, a second control gate inputting thereto the first control signal and a second test clock signal different in phase from both the clock pulse signal and the first test clock signal, and outputting therefrom a second control signal;

a second latch circuit inputting the selected signal and the second control signal to a data input terminal and an enable terminal thereof, respectively, and outputting a second latched signal and a third latch circuit inputting the second latched signal and the first control signal to a data input terminal and an enable terminal thereof, respectively, and outputting therefrom a data signal available as the scan input signal to an adjacent one of said plurality of scan circuits.

2. The scan path circuit as claimed in claim 1, wherein both the first test clock signal and the second test clock signal, and the clock mode signal have signal values thereof fixed in the non-testing period of said scan path circuit.

3. The scan path circuit as claimed in claim 1, further comprising: another said clock testing circuit receiving another clock signal to be tested, said another clock signal being different in phase from said clock pulse signal; and another plurality of said scan circuits respectively connected to said another clock testing circuit.

4. The scan path circuit as claimed in claim 1, further comprising:

another clock testing circuit receiving another clock signal to be tested and including:

a fourth latch circuit inputting thereto said another clock signal and said clock mode signal to a data input terminal and an enable terminal thereof, respectively, and outputting therefrom a third latched signal, and a third control gate inputting thereto said third latched signal and an inverse signal of said first test clock signal and outputting therefrom a third control signal; and another scan circuit connected to said another clock testing circuit and including:

another selector receiving another data input signal and said scan input signal from one of said plurality of scan circuits, for selecting either of them to be output as another selected signal in accordance with said scan mode signal, a fourth control gate inputting thereto said third control signal and an inverse signal of said second test clock signal, and outputting therefrom a fourth control signal:

a fifth latch circuit inputting said another selected signal and said fourth control signal to a data input terminal and an enable terminal thereof, respectively, and outputting therefrom a fourth latched signal, and a sixth latch circuit inputting said fourth latched signal and an inverse signal of said third control signal to a data input terminal and an enable terminal thereof, respectively, and outputting therefrom another data signal.

5. A scan path for testing multi-phase clocks from sequential circuits, the scan path circuit comprising:

a first clock testing circuit receiving a first clock signal inputted thereto and including:

a first latch circuit for inputting the first clock signal and a clock mode signal at a data input terminal and an enable terminal, respectively, to output a first latch output signal, and a first control gate for inputting the first latch output signal and a first test clock signal at two input terminals to output a first control output signal; and a plurality of first scan circuits respectively connected to said first clock testing circuit, each including:

a first selector, a second latch circuit for inputting either a data input signal or the first test clock signal at a data input terminal thereof either directly or via said first selector and inputting a scan mode signal at a selection terminal thereof to output a second latch output signal, the second latch circuit having an enable terminal, a third latch circuit for inputting the second latch output signal and the first control output signal at a data input terminal thereof and an enable terminal, respectively, to output a first data output signal which is inputted as a second scan input signal to an adjacent one of said plurality of first scan circuits; and a second control gate for inputting the first control output signal and a second test clock signal at two input terminals, the second control gate having an output terminal connected to the enable terminal of the second latch circuit, wherein said first scan circuits are operated as flip-flops during a non testing period, said first test clock signal, said second test clock signal and said clock mode signal are fixed to predetermined values at no testing time, and said first clock testing circuit is connected to either one of said scan circuits or said plurality of scan circuits, and having a second clock testing circuit for testing a negative clock signal, said second clock testing circuit inputting a second clock signal and including:

a fourth latch circuit for inputting said second clock signal and said clock mode signal at a data input terminal and an enable terminal thereof, respectively, to output a third latch output signal, and a third control gate for inputting said third latch output signal and an inverse signal of said first test clock signal at two input terminals thereof to output a second control output signal; and a second scan circuit connected to said second clock testing circuit and including:

a second selector;

a fifth latch circuit for inputting either a data input signal or said second test clock signal at a data input terminal thereof via said second selector and inputting said scan mode signal at a selection terminal thereof to output a fourth latch output signal, said fifth latch circuit having an enable terminal, a sixth latch circuit for inputting said fourth latch output signal and in invert signal for said second control output signal at a data input terminal and an enable terminal thereof, respectively to output a data output signal, a fourth control gate for inputting said second control output signal and said inverse signal of said second test control signal at two input terminals thereof, said fourth control gate having an output terminal connected to said enable terminal of said fifth latch circuit, and
a fifth control gate for generating said inverse signal of said second control output signal, said fifth control gate having an output terminal connected to said sixth latch circuit, wherein one of said first scan circuits further includes a further selector inserted between said second latch circuit and said third latch circuit and having two inputs respectively connected to an input terminal of said first selector and an output terminal of said second latch circuit, and an input terminal for inputting a test mode signal, said one of said first scan circuits being operated as a latch circuit when the test mode is not selected.

* * * * *